(12) United States Patent
Sugimae et al.

(10) Patent No.: US 9,595,327 B2
(45) Date of Patent: Mar. 14, 2017

(54) VARIABLE RESISTANCE MEMORY DEVICE AND VERIFY METHOD THEREOF

(71) Applicant: KABUSHIKI KAISHA TOSHIBA, Minato-ku (JP)

(72) Inventors: Kikuko Sugimae, Kuwana (JP); Reika Ichihara, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/847,395

(22) Filed: Sep. 8, 2015

(65) Prior Publication Data

US 2016/0260482 A1 Sep. 8, 2016

Related U.S. Application Data

(60) Provisional application No. 62/129,448, filed on Mar. 6, 2015.

(51) Int. Cl.
*G11C 13/00* (2006.01)

(52) U.S. Cl.
CPC ........ *G11C 13/0097* (2013.01); *G11C 13/004* (2013.01); *G11C 13/0064* (2013.01); *G11C 13/0069* (2013.01)

(58) Field of Classification Search
CPC ............ G11C 13/0004; G11C 13/0007; G11C 13/0009; G11C 13/0011; G11C 13/0014; G11C 13/0064; G11C 13/0069; G11C 13/0097; G11C 11/5614; G11C 11/5678; G11C 11/5685; G11C 2013/0045; G11C 2013/0064; G11C 2013/0078; G11C 2013/0083

See application file for complete search history.

(56) References Cited

U.S. PATENT DOCUMENTS

| 7,679,954 B2 * | 3/2010 | Lee | ..................... G11C 13/0004 365/100 |
| 8,289,762 B2 | 10/2012 | Kau et al. | |
| 8,295,076 B2 * | 10/2012 | Jeon | ........................ G11C 7/12 365/148 |
| 8,861,265 B2 | 10/2014 | Kurosawa et al. | |

(Continued)

FOREIGN PATENT DOCUMENTS

| JP | 2013-509666 | 3/2013 |
| JP | 2013-69374 | 4/2013 |

(Continued)

*Primary Examiner* — Andrew Q Tran
(74) *Attorney, Agent, or Firm* — Oblon, McClelland, Maier & Neustadt, L.L.P.

(57) ABSTRACT

A resistance variable memory has a controller configured to control a voltage to be applied to the memory cell. The controller has a reset operation to bring the memory cell into a reset state, a first operation to apply a set voltage between the first wire and the second wire, a second operation to determine whether a current flowing to the memory cell to be set exceeds a first threshold when a first reading voltage is applied between the first wire and the second wire, a third operation to determine whether a current flowing to the memory cell to be set exceeds a second threshold when a second reading voltage is applied between the first wire and the second wire, and a fourth operation to apply a second reset voltage, between the first wire and the second wire.

13 Claims, 8 Drawing Sheets

(56) References Cited

U.S. PATENT DOCUMENTS 9,224,462 B2 * 12/2015 Kwak ................ G11C 13/0023
2013/0010533 A1 1/2013 Bedeschi
2013/0088911 A1 4/2013 Nakura et al.
2014/0268999 A1 9/2014 Ichihara et al.

FOREIGN PATENT DOCUMENTS

| | | |
|---|---|---|
| JP | 2013-84324 | 5/2013 |
| JP | 5576494 | 8/2014 |
| JP | 2014-179146 | 9/2014 |
| WO | WO 2011/080770 A1 | 7/2011 |

* cited by examiner

VARIABLE RESISTANCE MEMORY DEVICE AND VERIFY METHOD THEREOF

CROSS REFERENCE TO RELATED APPLICATIONS

This application is based upon and claims the benefit of priority from the prior U.S. Provisional Patent Application No. 62/129,448 filed on Mar. 6, 2015, the entire contents of which are incorporated herein by reference.

FIELD

The present invention relates to a resistance variable memory and a verification method for the resistance variable memory.

BACKGROUND

Recently, a resistance variable memory which uses a variable resistance element as a storage element is focused as a successor of flash memory.

In a memory cell array of a resistance variable memory, memory cells including variable resistance elements are arranged at crossing points between bit lines and word lines. The bit lines and the word lines are arranged on a substrate surface and alternatively laminated, thereby constructing a memory cell array, in which memory cells are three-dimensionally arranged.

In the resistance variable memory, for example, memory cells positioned at crossing points between bit lines and word lines are brought into a low resistance state (set state) by applying a high predetermined voltage to the bit lines in comparison with the word lines. Further, the memory cells in the set state are brought into a high resistance state (reset state) by applying a high predetermined voltage to word lines connected to the memory cells in comparison with bit lines.

In a resistance variable memory, it is difficult to set an optimal reading voltage since a resistance value of a memory cell brought into the set state is changed by various conditions. Specifically, with respect to memory cells brought into the set state, data in the memory cells can be read at a lower voltage than the optimal reading voltage, and power consumption might be increased since a leak current flows from memory cells in a non-selected state.

Therefore, after a set operation is performed, a verification operation is preferably performed to check whether the memory cells are properly set.

However, a method for the verification operation of a resistance variable memory has not been established yet.

DETAILED DESCRIPTION

A resistance variable memory according to one embodiment has a plurality of first wires, a plurality of second wires extending in a direction crossing to the plurality of first wires, a plurality of memory cells including variable resistance elements arranged at each of crossing points between the first wires and the second wires, and a controller configured to control a voltage to be applied to the memory cell. The controller has a reset operation to bring the memory cell into a reset state by applying a first reset voltage to the memory cell, a first operation to apply a set voltage between the first wire and the second wire, which are connected to the memory cell to be set, a second operation to determine whether a current flowing to the memory cell to be set exceeds a first threshold when a first reading voltage is applied between the first wire and the second wire, which are connected to the memory cell to be set, after the first operation, a third operation to determine whether a current flowing to the memory cell to be set exceeds a second threshold when a second reading voltage is applied between the first wire and the second wire, which are connected to the memory cell to be set, when it has been determined in the second operation that the current has exceeded the first threshold, and a fourth operation to apply a second reset voltage, in which an absolute value is smaller than the first reset voltage, between the first wire and the second wire, which are connected to the memory cell to be set, when it has been determined in the third operation that the current has exceeded the second threshold.

Figure 1:
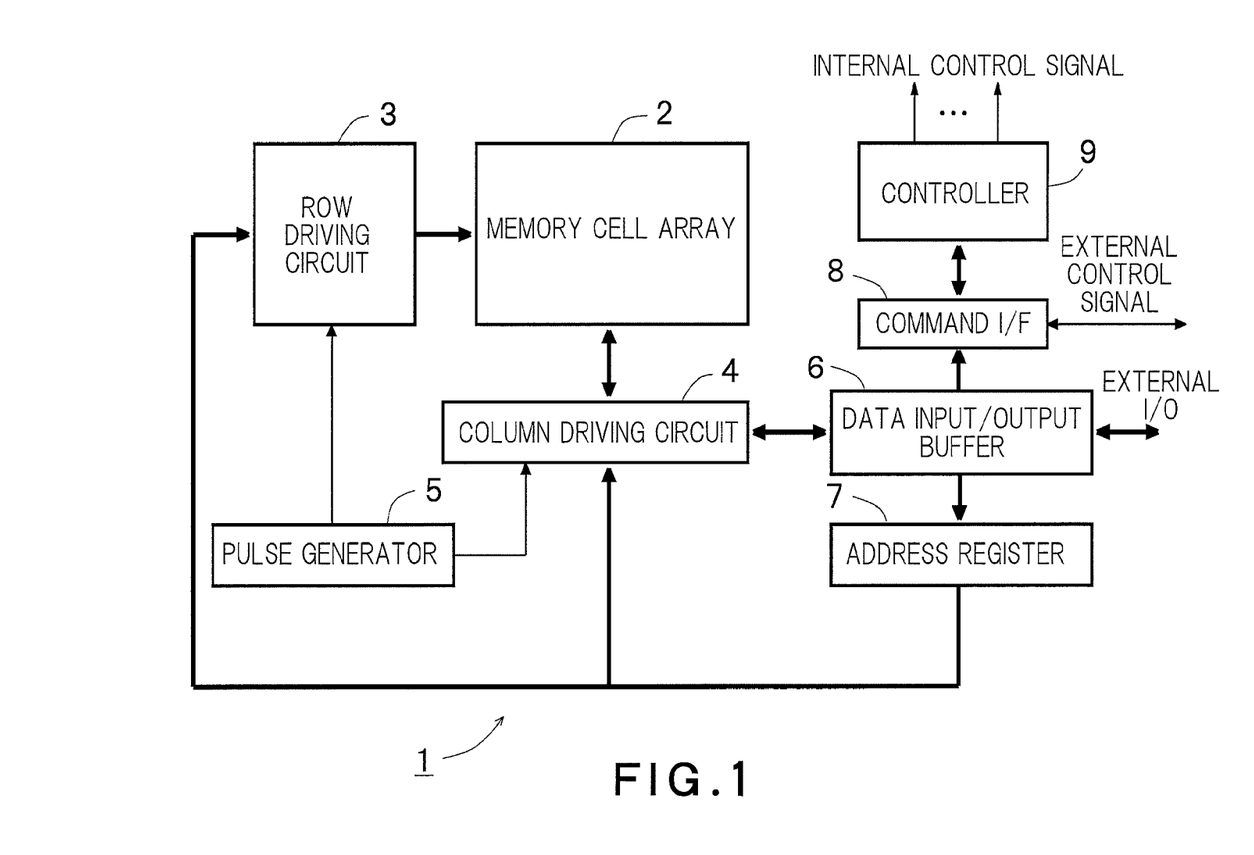
FIG. 1 is a block diagram illustrating an internal configuration of a resistance variable memory according to an embodiment.

An embodiment will be described below with reference to the figures. FIG. 1 is a block diagram illustrating an internal configuration of a resistance variable memory 1 according to the embodiment. The resistance variable memory 1 illustrated in FIG. 1 includes a memory cell array 2, a row driving circuit 3, a column driving circuit 4, a pulse generator 5, a data input/output buffer 6, an address register 7, a command interface (command I/F) 8, and a controller 9. A configuration omitted in FIG. 1 may be included in the resistance variable memory 1. A characteristic configuration in the resistance variable memory 1 will be mainly described below.

The memory cell array 2 includes multiple memory cells which are three-dimensionally arranged. Each of the memory cells is a resistance variable memory cell including a variable resistance element. The memory cell array 2 and the memory cells will be described in detail below.

The row driving circuit 3 controls an electric potential of multiple word lines arranged in the memory cell array 2. In the present description, a direction in which the multiple word lines extend is called a row direction.

The column driving circuit 4 controls electric potential of multiple bit lines arranged in the memory cell array 2. In the present description, a direction in which the multiple bit lines are arranged is called a column direction.

The pulse generator 5 generates a pulse signal synchronized with a timing at which the row driving circuit 3 and the column driving circuit 4 control electric potential of word lines and bit lines.

The data input/output buffer 6 is connected to a host device (not illustrated) via an external I/O line. The data input/output buffer 6 receives write data, an address, and a command from the external I/O line and sends, to the external I/O line, data read from a memory cell. The data input/output buffer 6 sends, to the address register 7, the address received from the external I/O line. The address register 7 sends the received address to the row driving circuit 3 and the column driving circuit 4. Further, the data input/output buffer 6 sends, to the column driving circuit 4, the data received from the external I/O line.

The command I/F 8 receives an external control signal from the outside and determines based on the external control signal whether the data input/output buffer 6 has received any of write data, an address, and a command from the outside. The command I/F 8 sends, to the controller 9, the command received from the external I/O by the data input/output buffer 6.

The controller 9 integrally controls the resistance variable memory 1. For example, the controller 9 controls writing, reading, and erasing with respect to memory cells based on a command from a host device. More specifically, the controller 9 selectively drives a word line and a bit line adjacent in a laminating direction. Further, the controller 9 controls to bring an arbitrary memory cell into the set state or the reset state as described below, and performs a reading control of a memory cell and a verification control of a memory cell in the set state.

Each transistor included in peripheral circuits other than the memory cell array 2 in the resistance variable memory 1 is formed on a semiconductor substrate arranged on a lower side of the memory cell array 2 in which memory cells are three-dimensionally laminated. The semiconductor substrate is, for example, a silicon substrate.

Figure 2:
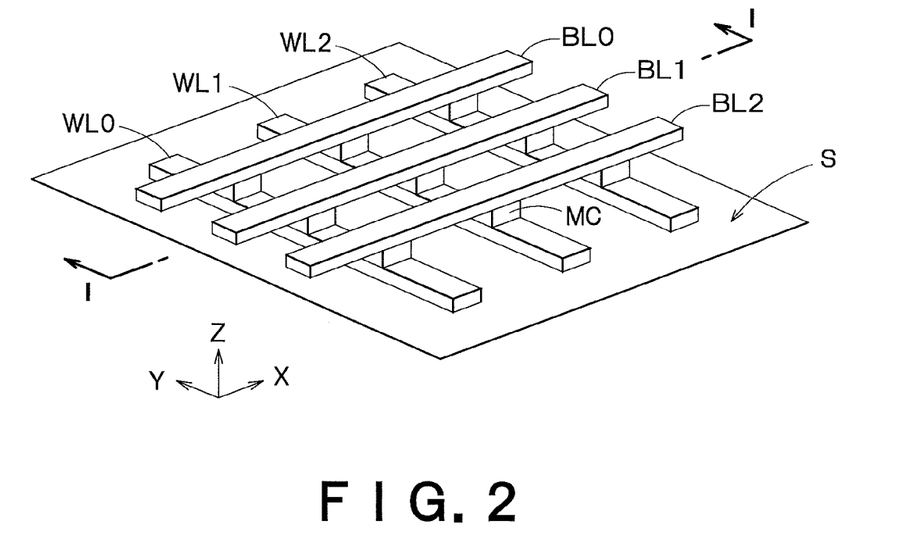
FIG. 2 is a partial perspective view of a memory cell array.
Figure 3:
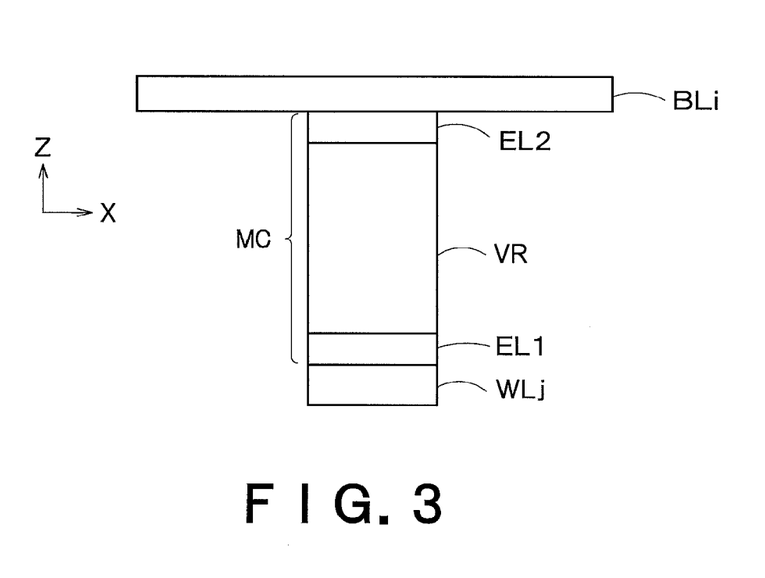
FIG. 3 is a sectional view of one memory cell seen in an arrow direction by cutting along the I-I' line in FIG. 2.

FIG. 2 is a partial perspective view of the memory cell array 2. FIG. 3 is a sectional view of one memory cell seen in an arrow direction by cutting along the I-I' line in FIG. 2. Word lines WL0 to WL2 as multiple first wires are arranged in a Y direction parallel to a surface of a semiconductor substrate S. Bit lines BL0 to BL2 as multiple second wires are arranged in an X direction parallel to a surface of the semiconductor substrate S so as to cross with the word lines WL0 to WL2. A memory cell MC is arranged at each of crossing points between the word lines WL0 to WL2 and the bit lines BL0 to BL2 so as to be sandwiched by the both lines. The first and second wires are preferably heat-resistant and made by a material having a low resistance value. For example, W, WN, WSi, NiSi, and CoSi can be used. The three word lines WL0 to WL2 and the three bit lines BL0 to BL2 are illustrated in FIG. 2. However, the number of the word lines and the bit lines are not particularly limited. In the present description, word lines and bit lines may be collectively called a word line WL and a bit line BL.

As illustrated in FIG. 3, the memory cell MC is a circuit connected to the variable resistance element VR between the bit line BL and the word line WL. Electrodes EL1 and EL2 functioning as a barrier metal and an adhesive layer are arranged vertically in a Z direction of the variable resistance element VR. The variable resistance element VR is arranged on the electrode EL1, and the electrode EL2 is arranged on the variable resistance element VR. In an electrode material of the electrode EL2, metallic elements forming a conductive filament is included. For example, Ag, Ni, Co, Al, Zn, Ti, Ta, and Cu can be selected as metallic elements used in the electrode EL2. Further, silicon, W, Ti, TiNx, TiSix, TiSixNy, Ta, TaNx, and TaSixNy, in which impurities are doped, may be laminated in the electrode EL2. Various metallic elements can be used as the electrode ELL For example, silicon, W, Ti, TiNx, TiSix, TiSixNy, Ta, TaNx, and TaSixNy, in which impurities are doped, may be selected, or a laminated structure of these materials may be selected.

A material, which can change a resistance value by voltage application via such as an electric field, current, heat, and chemical energy, can be used as the variable resistance element VR. The variable resistance element VR includes, for example, silicon oxide (SiOx) as a base material. Specifically, a single layer film of a silicon oxide (SiOx) or a structure, in which silicon oxide (SiOx), a semiconductor, and an insulator are laminated, is included. Silicon (Si) and hafnium oxide (HfOx) are used as a semiconductor or an insulator laminated in the silicon oxide (SiOx). As described later, the variable resistance element VR according to the embodiment has different current/voltage characteristics with respect to an applied voltage in accordance with a situation. By using this, the variable resistance element VR can be used as a selection element.

Figure 4:
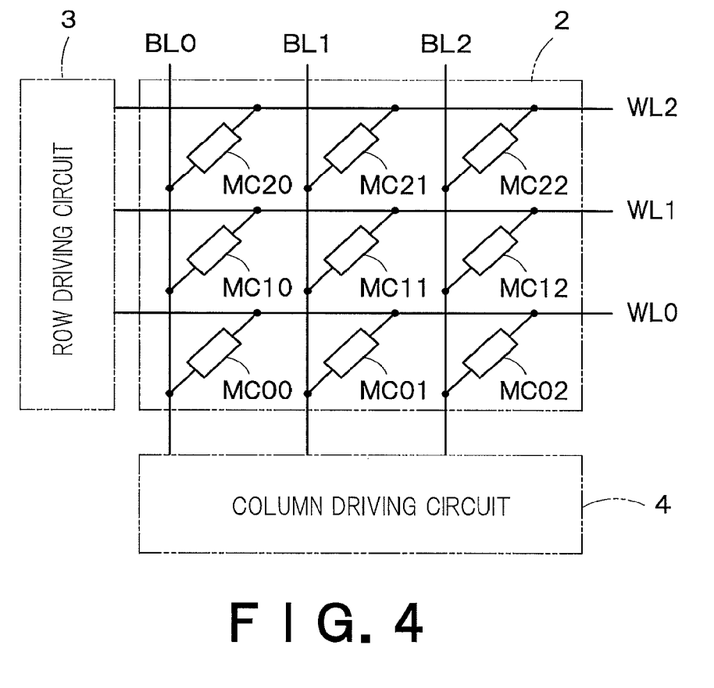
FIG. 4 is a circuit diagram of a memory cell array 2 and peripheral circuits thereof.

FIG. 4 is a circuit diagram of the memory cell array 2 and peripheral circuits thereof. One end of each bit line BL is connected to a column system peripheral circuit 2a which is a part of a column control circuit 2. Further, one end of each word line WL is connected to a row system peripheral circuit 3a which is a part of a row control circuit 3. A voltage needed in an operation with respect to the bit line BL and the word line WL by the column system peripheral circuit 2a and the row system peripheral circuit 3a is provided. Each of different functions needed for operation control of the bit line BL and the word line WL can be added to the column system peripheral circuit 2a and the row system peripheral circuit 3a.

Hereinafter, in the case where a voltage is applied to the memory cell MC so that the bit line BL becomes a high voltage and the word line WL becomes a low voltage, it is called that a positive voltage is applied. In the case where a voltage is applied to the memory cell MC so that the bit line BL becomes a low voltage and the word line WL becomes a high voltage, it may be called that a negative voltage is applied. In this case, the voltage positively applied to the memory cell MC is indicated as a positive voltage, and the voltage negatively applied to the memory cell is indicated as a negative voltage.

Figure 5:
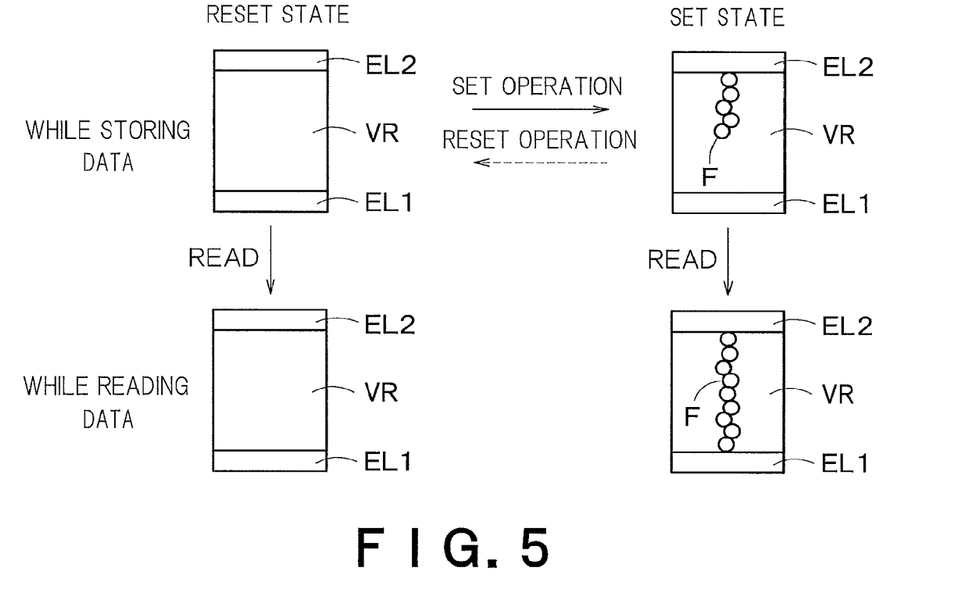
FIG. 5 is views for describing an operation method for a memory cell MC including a variable resistance element VR.

FIG. 5 is views describing an operation method for the memory cell MC including the variable resistance element VR.

By applying a predetermined voltage for a predetermined period to the variable resistance element VR of the selected memory cell MC, the selected memory cell MC is changed into the set state in which the variable resistance element VR electrically conducts at a lower voltage than the predetermined voltage. Hereinafter, an operation for changing the variable resistance element VR into the set state is called a set operation. The set state is a state in which a part of a conductive filament F connected to the electrodes EL1 and EL2 is cut.

On the other hand, by applying a predetermined voltage for a predetermined period to the variable resistance element VR of the selected memory cell MC in a direction reverse to the set operation, the selected memory cell MC is changed into the reset state in which the variable resistance element VR electrically conducts at higher voltage than the predetermined voltage. Hereinafter, an operation for changing the variable resistance element VR into the reset state is called a reset operation. The reset state is a state in which a cutting distance of the conductive filament F is longer than that in the set state.

In a reading operation, a predetermined reading voltage is applied to the variable resistance element VR of the selected memory cell MC. Accordingly, although the conductive filament F extends toward the electrode EL1 side, applied voltages needed to connect the conductive filament F to the electrode EL1 differ in the set state and the reset state. By utilizing the difference, a state of the selected memory cell MC can be read.

Figure 6:
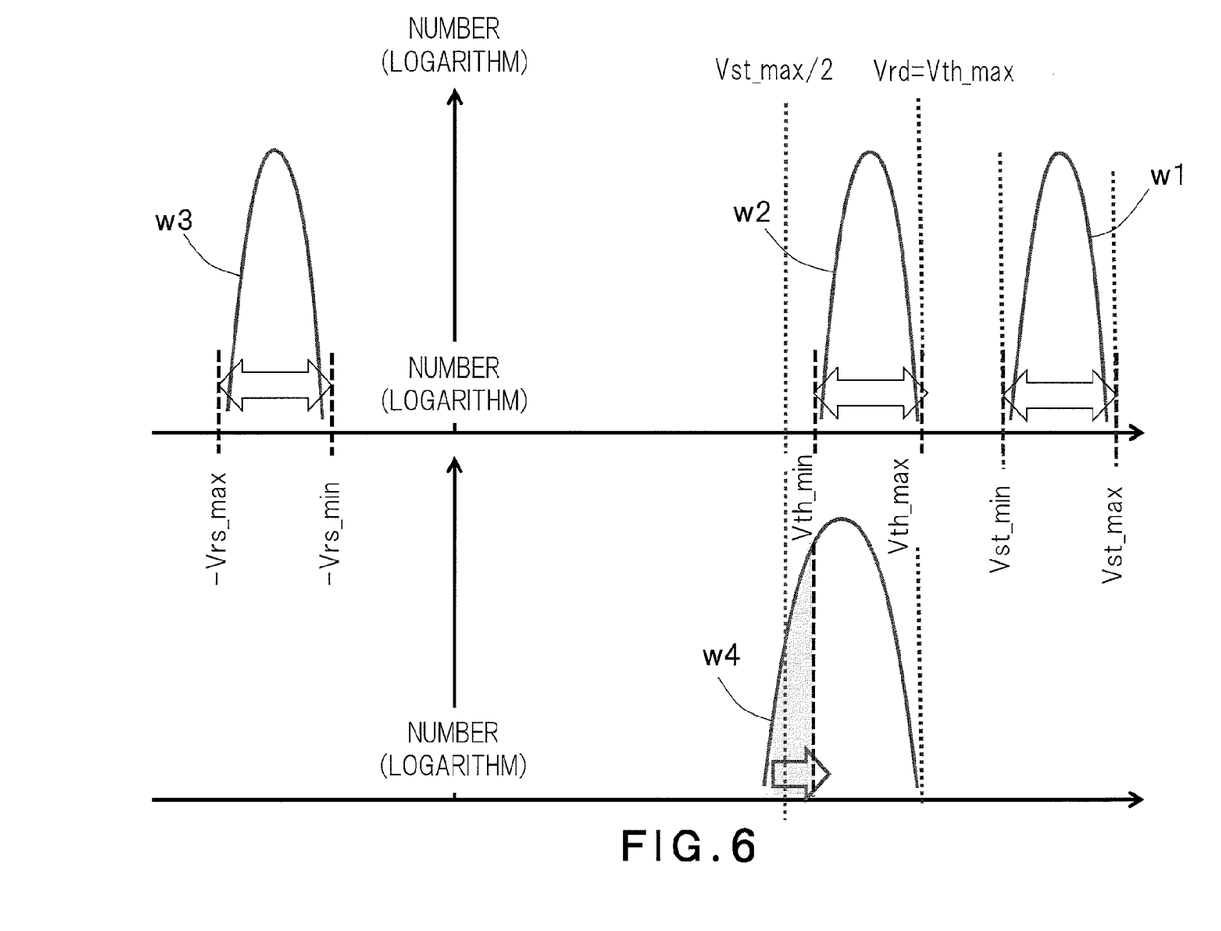
FIG. 6 is a graph illustrating a voltage distribution while setting and resetting.

FIG. 6 is a graph illustrating voltage distributions while setting and resetting. A set voltage needed to bring a memory cell into the set state is a voltage within a range of Vst_min to Vst_max as indicated in a waveform w1. By applying a voltage within this range to a memory cell, the memory cell is brought into the set state and a low resistance state. Memory cells have characteristic variation, and therefore voltages needed to bring into the set state differ depending on memory cells. However, every memory cells are brought in to the set state by applying the voltage Vst_max.

While a set voltage is applied to memory cells, the conductive filament F illustrated in FIG. 5 is connected to the electrodes EL1 and EL2 and in a conductive state.

When voltage application to the memory cell brought into the set state is stopped, a part of the conductive filament F is cut. A state in which a memory cell is brought into a low resistance state again in this state is called a second set state. A voltage needed to bring a memory cell into a second set state is, as indicated in a waveform w2, a voltage within a range of Vth_min to Vth_max, and becomes a voltage level lower than the voltage range Vst_min to Vst_max in the waveform w1.

Since memory cells have characteristic variation, voltages needed to bring the memory cells into the second set state differ depending on each memory cell. However, every memory cells are brought in to the second set state by applying the voltage Vth_max. Specifically, when data is read from a memory cell in the set state, the data can be stably read from any memory cells by applying the maximum voltage Vth_max indicated in the waveform w2. Therefore, this voltage Vth_max can be used as a reading voltage Vread.

Reading data means detecting whether a memory cell is brought into a low resistance state or is still in a high resistance state when the voltage Vth_max is applied to a memory cell. A current flows if the memory cell is in a low resistance state, and a current hardly flows if the memory cell is in a high resistance state. Therefore, it can be detected by detecting the magnitude of the current whether a memory cell is in the set state.

When a memory cell in the set state is brought into the reset state, a voltage (first reset voltage) reverse to the set state is applied to a bit line and a word line connected to the memory cell to be reset. In FIG. 6, an absolute value of voltage needed to bring a memory cell into the reset state is Vrs_min to Vrs_max as indicated in a waveform w3. Although memory cells have characteristic variation, every memory cells are brought into the reset state by applying the voltage Vrs_max in a reverse direction between a bit line and a word line. Herein, the reverse direction is to apply a voltage reverse to the set state so that a word line side becomes a high voltage.

In the case where voltage application to a memory cell is stopped after the set voltage is applied to a memory cell and the memory cell is brought into the set state, a waveform becomes a waveform w4, not the waveform w2 illustrated in FIG. 6. The waveform w4 becomes wider than the waveform w2 in which a voltage range needed to bring a memory cell into the second set state is an ideal voltage range. Therefore, a memory cell having characteristics of the waveform w4 becomes a low resistance state at a voltage lower than expected. Accordingly, even if the memory cell is in a non-selected state, it is brought into a low resistance state, and a leak current flows. As a result, consumption power is increased. Further, in the worst case, the memory cell might be incorrectly recognized as the set state, in spite of a non-set state.

In the embodiment, after the set voltage is applied to a memory cell, a verification operation is performed to check whether the memory cell is correctly brought into the set state. This verification operation is performed by the controller 9 illustrated in FIG. 1.

Figure 7:
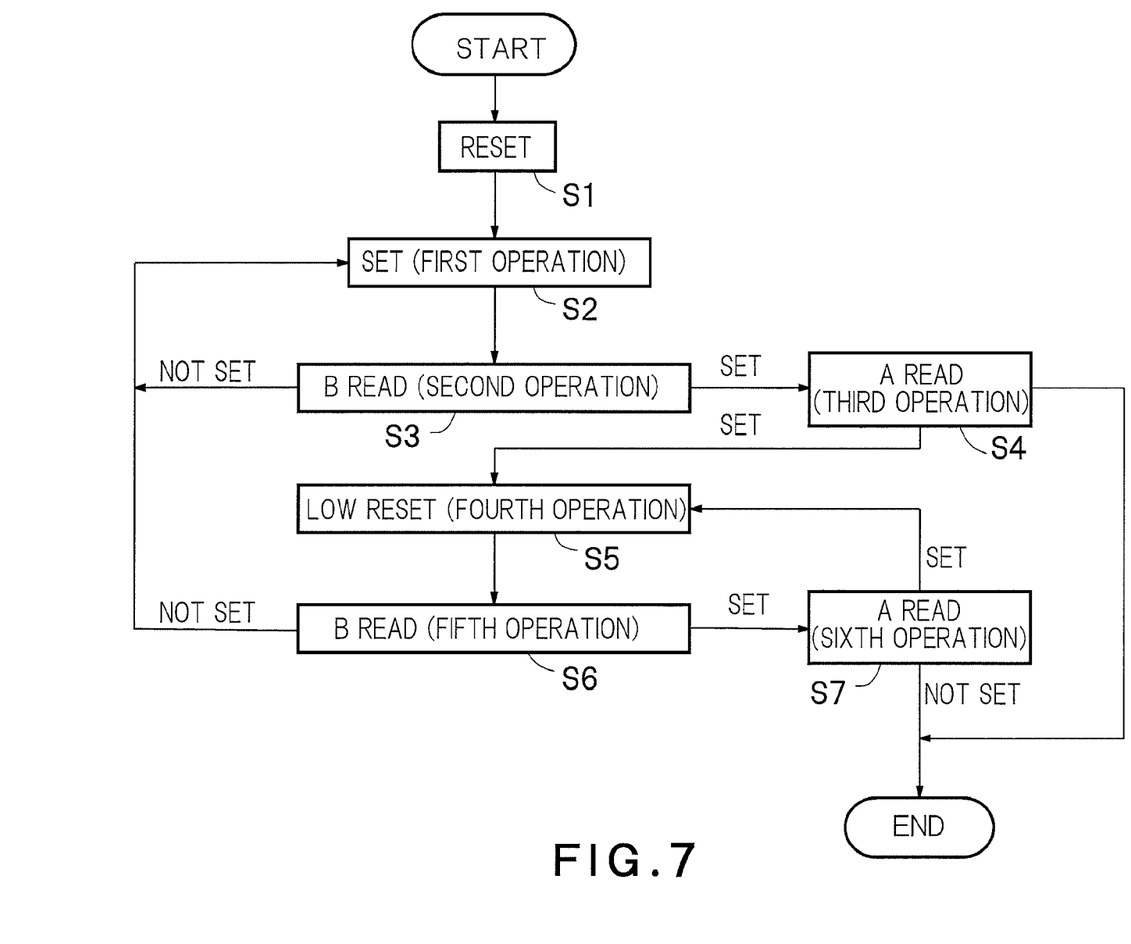
FIG. 7 is a flowchart illustrating an example of a processing procedure of a verification operation performed by a controller according the embodiment.
Figure 8A:
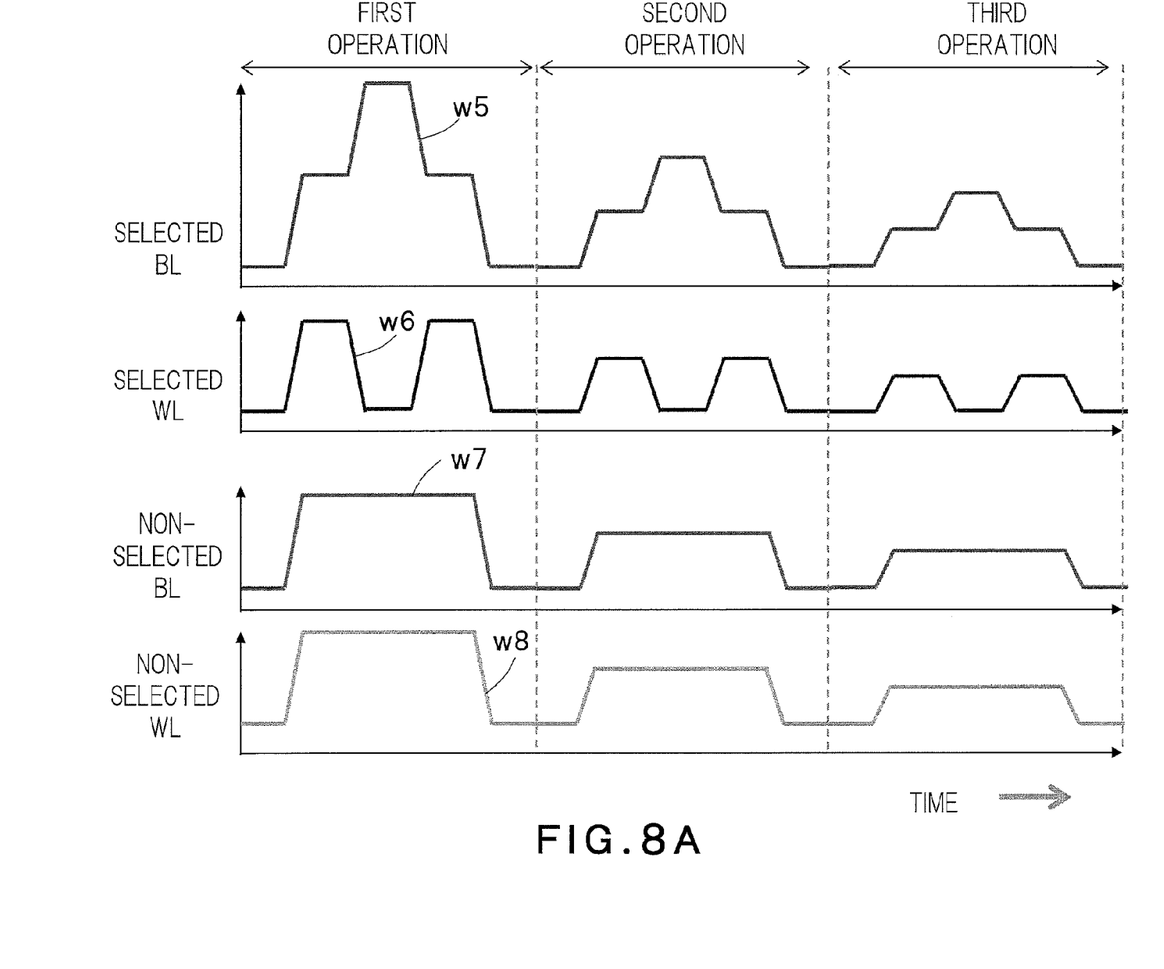
FIGS. 8A and 8B are voltage waveforms of word lines and bit lines in the verification operation.
Figure 8B:
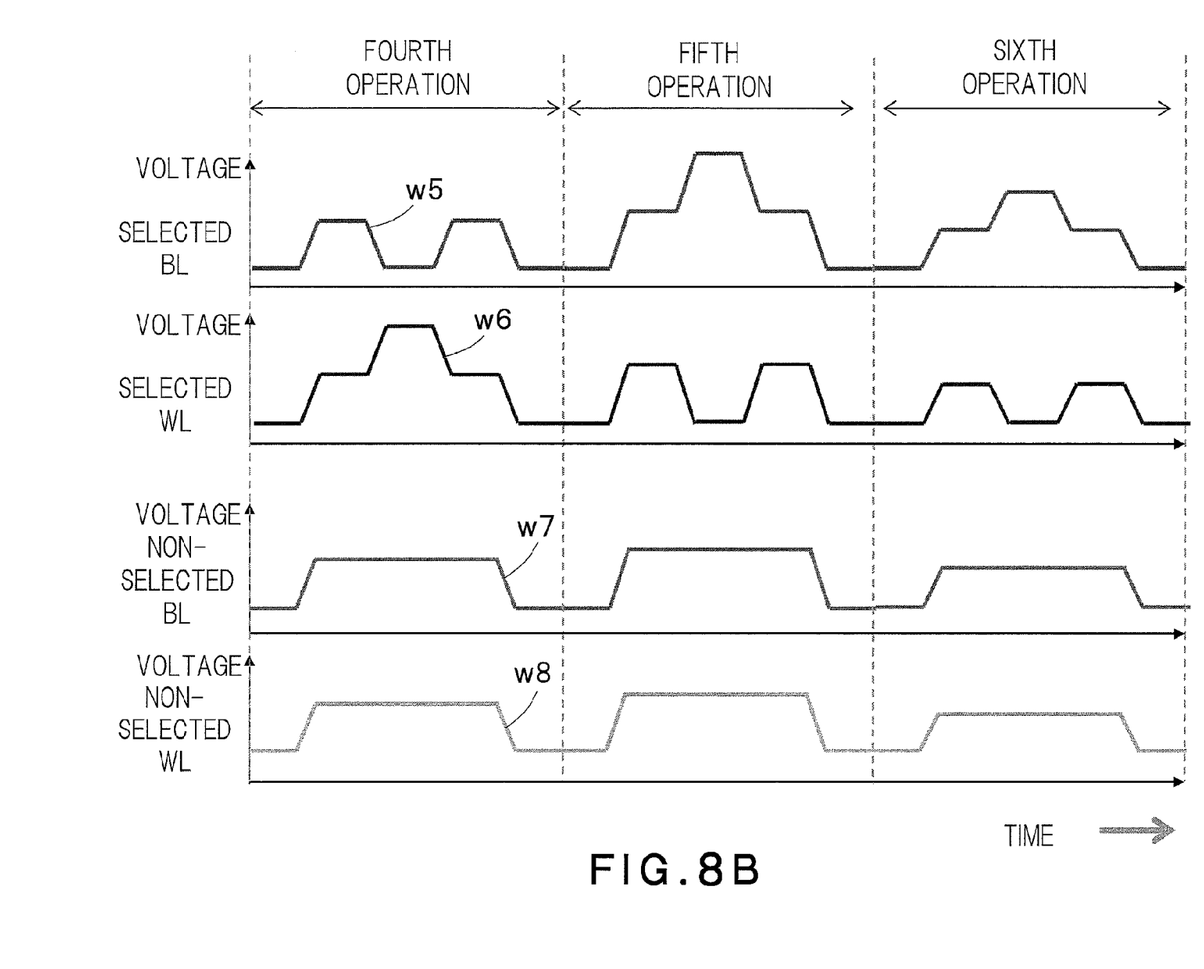
Figure 9:
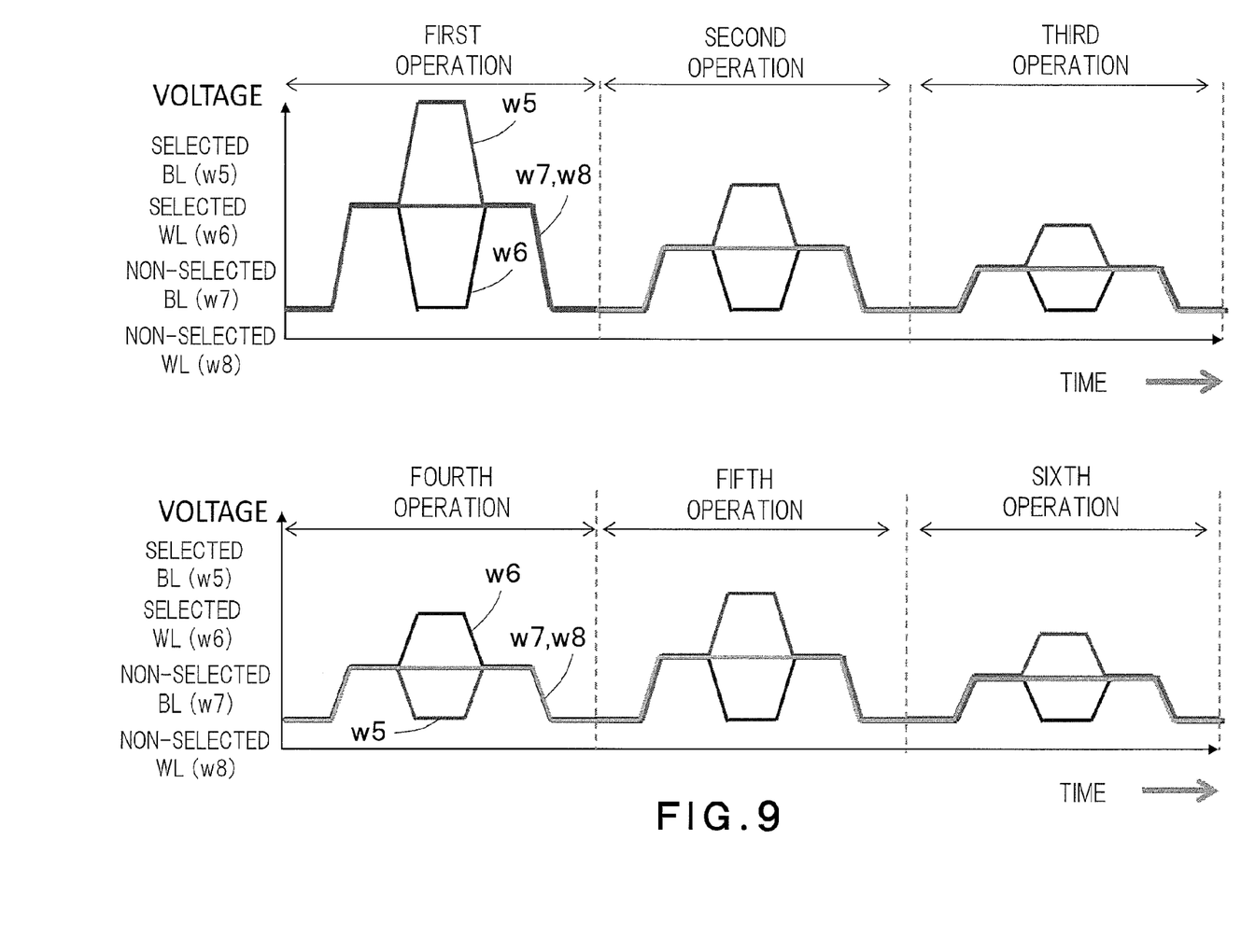
FIG. 9 is waveforms superimposing each voltage waveform illustrated in FIGS. 8A and 8B.

FIG. 7 is a flowchart illustrating an example of a processing procedure of the verification operation performed by the controller 9 according the embodiment. FIGS. 8A and 8B are voltage waveforms of word lines and bit lines in the verification operation. FIG. 9 is waveforms superimposing each voltage waveform illustrated in FIGS. 8A and 8B. FIGS. 8A, 8B, and 9 illustrate examples in which memory cells are brought into the set state by setting a high predetermined voltage to bit lines in comparison with word lines, and memory cells are brought into the reset state by setting a low predetermined voltage (ninth voltage) to bit lines in comparison with word lines.

First, a memory cell to be set is once reset (step S1). Herein, only a memory cell to be set may be brought into the reset state, and also multiple memory cells within a predetermined range (such as a unit of each bit line, each word line, each block, or each mat) including the memory cell to be set may be brought into the reset state as a unit. Further, processing in step S1 may be omitted.

Next, a bit line (selected bit line) connected to a memory cell to be set is set to a set voltage, and a word line (selected word line) connected to the memory cell is set to 0 V (step S2). This step S2 is processing for bringing a memory cell to be set into the set state and called a first operation. The set voltage is, for example, the voltage Vst_max in FIG. 6.

As described later, a resistance variable type memory cell can be brought into the set state or the reset state by switching control of a voltage level, and also can be brought into the set state or the reset state by adjusting a voltage application time, for example, by stabilizing a voltage level. Therefore, the set voltage is not necessarily a specific voltage level. The set voltage is a voltage satisfying the requirements for a voltage level and a voltage application period needed to set a memory cell.

FIGS. 8A, 8B, and 9 illustrate voltage waveforms in the case of switching a memory cell state and reading data by controlling a voltage level. In the case of switching a memory cell state and reading data by controlling a voltage application period, the voltage application period is changed in accordance with a flow process illustrated in FIG. 7, for example, by stabilizing the voltage level.

According to FIGS. 8A, 8B, and 9, selected bit lines are increased from 0 V to a preset voltage, further increased to a set voltage, again lowered to the preset voltage, and then returned to 0 V. The selected bit lines are set to the preset voltage before setting to the set voltage for precharging.

In the first operation, a non-selected bit line and a non-selected word line are set to an intermediate voltage (first voltage) which is approximately a half of the voltage Vst_max of a selected bit line.

Next, in the first operation, data is read to check whether a memory cell to be set is brought into the set state (step S3). The processing in step S3 is called a B read or a second operation. In the second operation, Vth_max which is the maximum voltage (first reading voltage) of the waveform w2 illustrated in FIG. 6 is applied to a memory cell to be set as the reading voltage Vread. More specifically, as illustrated in FIGS. 8A, 8B, and 9, Vth_max is applied to a bit line connected to the memory cell to be set, and a word line connected to the memory cell is set to 0 V. If the memory cell to be set is normally set, a conductive filament becomes a low resistance state by electrically conducting between the electrodes EL1 and EL2 by applying the reading voltage Vread=Vth_max, and a current flows. Therefore, it is determined depending on the magnitude of the current flowing to the memory cell whether the memory cell is in the set state. More specifically, when the reading voltage Vread=Vth_max is applied, it is determined whether the current flowing to the memory cell exceeds a first threshold.

As described above, data can be normally read by controlling a voltage application period by stabilizing a voltage level in a resistance variable type memory cell. Therefore, the reading voltage Vread=Vth_max is not necessarily a specific voltage level. The reading voltage Vread=Vth_max is a voltage (first reading voltage) corresponding to an upper limit of the requirements for a voltage level and a voltage application period, which are needed to read data from a memory cell.

In the case where data is read by controlling a voltage level, as illustrated in FIGS. 8A, 8B, and 9, the reading voltage Vread=Vth_max is lower than the set voltage in the first operation. In the case where the reading voltage Vread=Vth_max is applied to a memory cell, a voltage is once set to a prereading voltage lower than the reading voltage Vread. After setting to the reading voltage Vread, the voltage is once set to the prereading voltage and returned to 0 V.

During the B read (second operation), a non-selected bit line and a non-selected word line are set to an intermediate voltage (second voltage) which is approximately a half of the reading voltage Vread=Vth_max of a selected bit line.

In the B read (second operation) in step S3, if a current does not flow even if the reading voltage Vread is applied to a memory cell to be set, it is determined that the memory cell is not in the set state. In this case, processing is returned to step S2, the set operation is again performed (first operation). At this time, a voltage higher than a voltage applied when the set operation has been first performed may be applied to a bit line connected to a memory cell to be set. Alternatively, the same voltage as the voltage applied when the set operation has been first performed is applied to the memory cell to be set, and a voltage application period may be prolonged.

On the other hand, in the case where it is determined in the B read (second operation) in step S3 that the memory cell to be set has been brought into the set state, it is checked whether a current flows, by setting the reading voltage Vread of the memory cell to be set to the reading lower limit voltage Vth_min illustrated in FIG. 6 (step S4). More specifically, when the reading voltage Vread=Vth_min is applied, it is determined whether the current flowing to the memory cell exceeds a second threshold. In the present description, this reading operation is called an A read (third operation).

The reading voltage Vread=Vth_min is not limited to a specific voltage level. The reading voltage Vread=Vth_min is a voltage (second reading voltage) corresponding to a lower limit of the requirements for a voltage level and a voltage application period, which are needed to read data from a memory cell.

During the A read (third operation), a non-selected bit line and a non-selected word line are set to an intermediate voltage (third voltage) which is approximately a half of the reading voltage Vread=Vth_min of a selected bit line.

In the A read (third operation), if a current is flown to a memory cell in which the reading lower limit voltage Vth_min is applied, it is determined that the set state of this memory cell is not normal. In this case, a voltage distribution of a memory cell is thought to be spread like the waveform w4 illustrated in FIG. 6. Therefore, this memory cell is brought into a low reset state (step S5). In this step S5, a reverse voltage (second reset voltage, fourth voltage), in which an absolute value of a voltage level is smaller than that in the normal reset state, is applied to a memory cell to be set. By applying this reverse voltage, a voltage distribution of the memory cell is narrowed from the waveform w4 to the waveform w2 illustrated in FIG. 6, and a reading voltage needed to bring the memory cell into a low resistance state can be raised. In the present description, processing in the low reset state is called a fourth operation.

To bring a memory cell into the low reset state, a voltage may be the same as the voltage applied in the normal reset state, and a voltage application period may be shortened. Specifically, the voltage applied to the memory cell to bring it into the low reset state is a reverse voltage which is not satisfied with the requirements for a voltage level and a voltage application period needed to reset the memory cell.

During the fourth operation, a non-selected bit line and a non-selected word line are set to an intermediate voltage (eighth voltage) which is approximately a half of a voltage of a selected word line.

After the fourth operation in step S5 is finished, the B read (fifth operation) is performed (step S6). Herein, as with step S3, the reading voltage Vread=Vth_max is applied to a bit line connected to a memory cell to be set, and the word line is set to 0 V, to check whether this memory cell is brought into a low resistance state. Further, during the B read (fifth operation), a non-selected bit line and a non-selected word line are set to an intermediate voltage which is approximately a half of the voltage Vread=Vth_max of a selected bit line.

As a result of performing the B read (fifth operation) in step S6, in the case where a current does not flow to a memory cell to be set, processing is returned to step S2, and the first operation is performed. At this time, a voltage higher than the voltage applied when the first operation has been performed last time may be applied to a memory cell to be set, or the same voltage level as the voltage level in the last first operation is applied to the memory cell to be set, and a voltage application period may be prolonged.

On the other hand, as a result of performing the B read (fifth operation) in step S6, in the case where a current flows to a memory cell to be set, the memory cell is determined that it is in the set state, and the A read (sixth operation) is performed (step S7). Herein, as with step S4, the reading voltage Vread=Vth_min is applied to a bit line connected to a memory cell to be set, and the word line is set to 0 V, to check whether this memory cell is brought into a low resistance state. Further, during the A read (sixth operation), a non-selected bit line and a non-selected word line are set to an intermediate voltage which is approximately a half of the voltage Vread=Vth_min of a selected bit line.

As a result of performing the A read (sixth operation) in step S7, in the case where a current flows to a memory cell to be set, it is determined that a voltage distribution of the memory cell is still excessively spreading, processing is returned to step S5, and again low reset is performed. On the other hand, in the case where a current flows to the memory cell to be set, a verification process is finished.

FIGS. 7 to 9 illustrate examples that the controller 9 performs switching control of voltages of a bit line and a word line among the first to sixth operations. However, as described above, to bring a memory cell into the set state and the reset state, in addition to a method for switching a voltage level, there is a method for switching a voltage application period.

An inventor of the present invention has evaluated applied voltage dependency of a current flowing to a memory cell and a voltage applying time dependency. Consequently, it has been found that the more voltage is applied to a memory cell, the more current flows to the memory cell. Similarly, it has been found that a current flowing to a memory cell increases as a voltage application period to the memory cell is prolonged.

Therefore, as illustrated in FIGS. 8A, 8B, and 9, the voltage application period may be precisely controlled instead of precisely controlling voltages of a bit line and a word line in the first to eight operations or while switching control of the voltages. Specifically, in the case where a memory cell is brought into the set state or the reset state, a voltage application period of a bit line and a word line in which a voltage is applied may be adjusted.

In this manner, according to the embodiment, the B read (second operation) is performed to confirm whether a memory cell to be set is brought into the set state after the first operation in which a predetermined voltage is applied between a bit line and a word line connected to the memory cell. If it has been determined that the memory cell is set, the A read (third operation) is performed next. If it has been determined that the memory cell is not set, a low reset (fourth operation) is performed. Accordingly, even if a set voltage distribution of a memory cell is spread out than expected in the first operation for the first time, the voltage distribution can be appropriately narrowed by low reset, and the memory cell can be correctly set to the set state. Further, a leak current from a memory cell which is not appropriately set can be controlled.

Furthermore, a memory cell, which is once set to the low reset state, can be checked whether a set/reset voltage distribution of the memory cell is practical, by performing low reset by performing the B read (fifth operation) and the A read (sixth operation) again.

As described above, according to the embodiment, a verification process to confirm whether a memory cell in which a set voltage is applied is correctly set to the set state can be reliably performed by a simple method.

In the above embodiment, an example has been described in which a memory cell is brought into the set state by raising a voltage of a bit line in comparison with a word line and brought into the reset state by raising a voltage of a word line in comparison with a bit line. However, the memory cell may be brought into the set state by raising a voltage of a word line in comparison with a bit line and brought into the reset state by raising a voltage of a bit line in comparison with a word line.

Although multiple embodiments according to the present invention have been described, these embodiments are presented as examples and are not intended to limit the scope of the invention. These new embodiments can be performed in other various modes, and can be omitted, replaced and changed variously without departing from the gist of the invention. These embodiments and variations thereof are included in the gist and scope of the invention and included in the invention described in claims and a scope equivalent thereto.

The invention claimed is:

1. A resistance variable memory, comprising:
a plurality of first wires;
a plurality of second wires extending in a direction crossing to the plurality of first wires;
a plurality of memory cells including variable resistance elements arranged at each of crossing points between the first wires and the second wires; and
a controller configured to control a voltage to be applied to a memory cell,
wherein the controller comprises:
a reset operation to bring the memory cell into a reset state by applying a first reset voltage to the memory cell;
a first operation to apply a set voltage between a first wire and a second wire, which are connected to the memory cell to be set;
a second operation to determine whether a current flowing to the memory cell to be set exceeds a first threshold when a first reading voltage is applied between the first wire and the second wire, which are connected to the memory cell to be set, after the first operation;
a third operation to determine whether the current flowing to the memory cell to be set exceeds a second threshold when a second reading voltage is applied between the first wire and the second wire, which are connected to the memory cell to be set, when it has been determined in the second operation that the current has exceeded the first threshold; and
a fourth operation to apply a second reset voltage, in which an absolute value is smaller than the first reset voltage, between the first wire and the second wire, which are connected to the memory cell to be set, when it has been determined in the third operation that the current has exceeded the second threshold.

2. The resistance variable memory according to claim 1, wherein the set voltage is a voltage satisfying requirements for a voltage level and a voltage application period needed to set the memory cell,
wherein the first reading voltage is a voltage corresponding to an upper limit in the requirements for the voltage level and the voltage application period needed to read the memory cell,
wherein the second reading voltage is a voltage corresponding to a lower limit in the requirements for the voltage level and the voltage application period needed to read the memory cell, and
wherein the second reset voltage is a voltage corresponding to a low reset state which does not satisfy a voltage level and a voltage application period needed to reset the memory cell.

3. The resistance variable memory according to claim 1, wherein a voltage level of the set voltage is higher than a voltage level of the first reading voltage, and the voltage level of the first reading voltage is higher than a voltage level of the second reading voltage.

4. The resistance variable memory according to claim 1, wherein the controller performs the first operation again with respect to the memory cell to be set when it has been determined in the second operation that the current has not exceeded the first threshold.

5. The resistance variable memory according to claim 1, wherein the controller determines that the memory cell to be set is set when it has been determined in the third operation that the current has not exceeded the second threshold.

6. The resistance variable memory according to claim 1, wherein the controller comprises:
- a fifth operation to determine whether the current flowing to the memory cell to be set exceeds the first threshold when the first reading voltage is applied between the first wire and the second wire, which are connected to the memory cell to be set, after the fourth operation; and
- a sixth operation to determine whether the current flowing to the memory cell to be set exceeds the second threshold when the second reading voltage is applied between the first wire and the second wire, which are connected to the memory cell to be set, when it has been determined in the fifth operation that the current has exceeded the first threshold.

7. The resistance variable memory according to claim 6, wherein the controller performs the first operation again with respect to the memory cell to be set when it has been determined in the fifth operation that the current has not exceeded the first threshold.

8. The resistance variable memory according to claim 6, wherein the controller determines that the memory cell to be set is set when it has been determined in the sixth operation that the current has not exceeded the second threshold.

9. The resistance variable memory according to claim 1, wherein the controller applies the set voltage to one of the first wire and the second wire connected to the memory cell to be set and applies 0 V to another of the first wire and the second wire connected to the memory cell to be set in the first operation, and applies a first voltage, which is lower than the set voltage and higher than 0 V, to the other first wires and second wires.

10. The resistance variable memory according to claim 9, wherein the controller applies the first reading voltage to one of the first wire and the second wire connected to the memory cell to be set and applies 0 V to another of the first wire and the second wire connected to the memory cell to be set in the second operation, and applies a second voltage, which is lower than the first voltage and higher than 0 V, to the other first wires and second wires.

11. The resistance variable memory according to claim 10, wherein the controller applies the second reading voltage to one of the first wire and the second wire connected to the memory cell to be set and applies 0 V to another of the first wire and the second wire connected to the memory cell to be set in the third operation, and applies a third voltage, which is lower than the second voltage and higher than 0 V, to the other first wires and second wires.

12. The resistance variable memory according to claim 11, wherein the controller applies a fourth voltage to the first wire or the second wire, which is connected to the memory cell to be set and in which a high voltage has not been applied in the first operation, and applies 0 V to another of the first wire and the second wire connected to the memory cell to be set in the fourth operation, and applies a fifth voltage, which is higher than 0 V, to the other first wires and second wires.

13. The resistance variable memory according to claim 1, wherein the controller performs the reset operation before performing the first operation with respect to the memory cell to be set.

* * * * *